US012597878B1

(12) United States Patent (10) Patent No.: US 12,597,878 B1
Allison et al. (45) Date of Patent: Apr. 7, 2026

(54) ALBEDO COLLECTING SOLAR ARRAY

(71) Applicant: Government of the United States as represented by the Secretary of the Air Force, Kirtland AFB, NM (US)

(72) Inventors: Jonathan Allison, Albuquerque, NM (US); Christopher Kerestes, Oakwood, OH (US)

(73) Assignee: United States of America as represented by the Secretary of the Air Force, Kirtland AFB, NM (US)

( * ) Notice: Subject to any disclaimer, the term of this patent is extended or adjusted under 35 U.S.C. 154(b) by 0 days.

(21) Appl. No.: 18/759,991

(22) Filed: Jun. 30, 2024

(51) Int. Cl.
| | |
|---|---|
| *H02S 10/00* | (2014.01) |
| *H02S 20/32* | (2014.01) |
| *H10F 19/40* | (2025.01) |
| *H10F 77/00* | (2025.01) |
| *H10F 77/42* | (2025.01) |
| *H10F 77/70* | (2025.01) |

(52) U.S. Cl.
CPC .............. *H02S 10/00* (2013.01); *H02S 20/32* (2014.12); *H10F 19/40* (2025.01); *H10F 77/488* (2025.01); *H10F 77/70* (2025.01); *H10F 77/95* (2025.01)

(58) Field of Classification Search
CPC .......... H02S 10/00; H02S 20/32; H10F 19/40; H10F 77/488; H10F 77/70; H10F 77/95
See application file for complete search history.

(56) References Cited

U.S. PATENT DOCUMENTS

| | | | |
|---|---|---|---|
| 5,990,413 A | 11/1999 | Ortabasi | |
| 6,173,923 B1 * | 1/2001 | Penera | B64G 1/443 |
| | | | 244/172.7 |
| 2009/0255567 A1 * | 10/2009 | Frolov | H10F 19/40 |
| | | | 136/246 |
| 2011/0017285 A1 | 1/2011 | Cornfeld | |
| 2017/0207354 A1 * | 7/2017 | Lee | H10F 71/138 |
| 2018/0097133 A1 * | 4/2018 | Anthony | H10F 19/00 |

OTHER PUBLICATIONS

Steven L. Rickman, Introduction to On-Obrit Thermal Enviroments, Thermal and Fluids Analysis Workshop, Aug. 2014, Slides: 36-53, NASA Goddard Space Flight Center, Cleveland OH, USA.
V.A Letin et al., Bifacial Solar arrays of Russian space crafts, 2000 Conference Record of the Twenty-Eighth IEEE Photovoltaic Specialists Conference, Sep. 15-22, 2000, pp. 1067-1070, USA.

* cited by examiner

*Primary Examiner* — Michael Y Sun
(74) *Attorney, Agent, or Firm* — AFNWC/JA; David L. Narciso, Sr.

(57) ABSTRACT

A solar array, comprising: at least one solar panel comprising a primary surface and a secondary surface; the primary surface having a group of direct solar cells disposed thereon, each of the direct solar cells configured to receive direct sunlight and to provide electrical power to a respective portion of a substantially flat flexible circuit; and the secondary surface having a group of indirect solar cells disposed thereon, each of the indirect solar cells configured to receive reflected sunlight and to provide electrical power to a respective portion of a substantially flat flexible circuit.

20 Claims, 4 Drawing Sheets

Current Solar Array Pointing CONOPs

Improved Albedo Array Pointing CONOPs

ALBEDO COLLECTING SOLAR ARRAY

GOVERNMENT INTEREST

The invention described herein may be manufactured and used by or for the Government of the United States for all governmental purposes without the payment of any royalty.

FIELD OF THE DISCLOSURE

The present invention relates generally to a satellite-deployed solar array configured to receive solar radiation from a sun-facing side and albedo from a not-sun-facing side.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Increasing power generation per deployed area (kWe/m2) is a priority for spacecraft Electrical Power Subsystem (EPS) tech development since increased power generation capability for a given size, mass, rotational inertia, and cost enables EPS costs to be kept low while also supporting future generations of high power satellites. Solar arrays are generally the largest part on the satellite, so reductions in solar array size reduce the cross section exposed to threats. Deployable spacecraft solar arrays' (DSSAs) structures today are often honeycomb solar panel structures with multiple solar panels that unfold in an accordion array. Alternative designs with improved mass efficiency may use, for example, a flexible structure to support the solar cells and various other hardware (i.e., the flexible structure is in turn supported by separate rigid support structure).

The front side of DSSAs are covered in photovoltaic solar cells, while the back sides of DSSAs are painted black (occasionally white) or comprise a naturally infrared emissive surface such as carbon fiber composite and are very sparsely covered in harness to remove power from the solar cells as well as power management and distribution (PMAD) devices.

The front side of a DSSA tracks the sun by means of actuator mechanisms, sun sensors and/or other sensors, and control algorithms. The back side of a DSSA is generally finished with a high IR emissivity finish because high IR emissivity is required in order to insure that the thermal radiation is emitted off the backside (as well as the front side, whose solar cells are also substantially high emissivity), thus keeping the temperature of the solar array lower than it would if the back side had low IR emissivity, such as if it were a bare metal finish.

Solar arrays with black painted back sides can typically run between 50° C. to 70° C. when in the sun, if those back sides were bare metal finishes, they would run about 130° C., causing negative impacts to the photovoltaic conversion efficiency of the solar cells. Solar arrays with white painted back sides allow solar array temperatures to run about 10° C. cooler in environments where albedo is a significant heat source (such as low earth orbit at low beta angles). The earth's reflectivity in the solar spectrum is about 30%, so a substantial amount of energy is in question, particularly when a satellite flies in a low orbit over the subsolar point of the earth.

SUMMARY OF THE INVENTION

Various deficiencies in the prior art are addressed below by the disclosed albedo array (AA) having photovoltaic (PV) cells on both the front or primary side (sun-facing) and back or secondary side (not-sun-facing) of a solar array such as in low earth orbit (LEO). Flexible circuit power routing may be used to allow harnessing to be beneath the PV cells, eliminating light blockage attributable to harnessing. Various improved Concepts of Operation (CONOPs) may be used, such as pointing the AA in order to use the AA's physical material to minimize exposure of the PV cells on AA to ionizing radiation, thus extending their mission life and/or enhancing their power at End-of-Life (EOL). Various AA implementations provide for DSSAs that are either Fixed or Gimballed. Identification of the orbits where AA provides the most value may be used to adapt the CONOPs and further optimize the embodiments.

In one embodiment, a solar array comprises: at least one solar panel comprising a primary surface and a secondary surface; the primary surface having a group of direct solar cells disposed thereon, each of the direct solar cells configured to receive direct sunlight and to provide electrical power to a respective portion of a substantially flat flexible circuit; and the secondary surface having a group of indirect solar cells disposed thereon, each of the indirect solar cells configured to receive reflected sunlight and to provide electrical power to a respective portion of a substantially flat flexible circuit.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments of the present invention given below, serve to explain the principles of the present invention.

Figure 1:
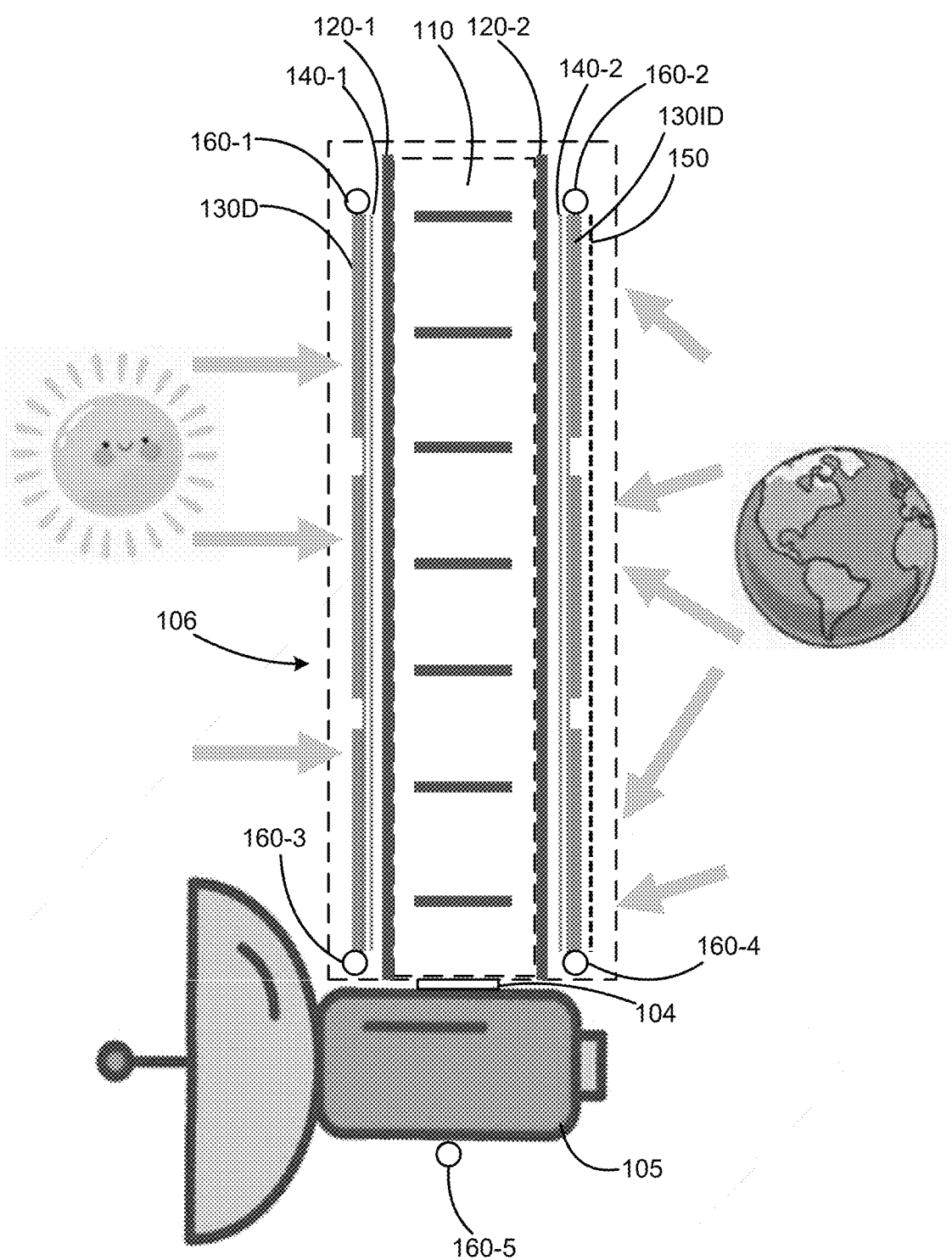
FIG. 1 depicts a satellite-deployed albedo array (AA) in accordance with various embodiments.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for illustrative purposes to aid the reader in understanding the principles of the invention and the concepts contributed by the inventor(s) to furthering the art and are to be construed as being without limitation to such specifically recited examples and conditions. Additionally, the term, "or" as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments.

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein. It must be noted that as used herein and in the appended claims, the singular forms "a", "an", and "the" include plural referents unless the context clearly dictates otherwise.

Various embodiments provide an albedo array (AA) having photovoltaic (PV) cells on both a front side (primary or sun-facing side) and a back side (secondary or not-sun-facing side) of a solar array such as in low earth orbit (LEO). Flexible circuit power routing may be used to avoid harnesses and light blockage attributable thereto. Various improved Concepts of Operation (CONOPs) may be used, such as for pointing the AA in order to use the AA's physical material to minimize exposure of the PV cells on AA to ionizing radiation, thus extending their mission life and/or enhancing their power at End-of-Life (EOL). Various AA implementations for DSSAs that are either Fixed or Gimballed. Identification of the orbits where AA provides the most value may be used to adapt the CONOPs and further optimize the embodiments.

A solar array deployed by a satellite may comprise one or more solar panels including at least one solar panel formed as an albedo array (AA). The one or more solar panels may be stowed in an undeployed position and then mechanically rotated about its axis by a deployment mechanism into a deployed position. Typically, the deployment mechanism is single-use and enables cheap/reliable deployment and firm fixturing prior to deployment (to accommodate launch vibrations). Multiple solar panels may be stacked and coupled together in an undeployed mode as a solar wing folded into an accordion like shape. The solar wing may then be deployed as two or more solar wing panels or a multiple solar panel array. Multiple solar wings may be deployed by a satellite.

FIG. 1 depicts an albedo array (AA) in accordance with various embodiments. Specifically, FIG. 1 depicts a satellite 105 having deployed therefrom a single solar panel albedo array 106 comprising photovoltaic (PV) cells configured to receive direct sunlight as well as PV cells configured to receive indirect sunlight (i.e., sunlight reflected from the earth). It is noted that multiple AAs 106 may be used/deployed. Further, each AA 106 may comprise one or more solar panels.

Specifically, each AA 106 may comprise a solar panel having front or primary surface and a back or secondary surface; the primary surface having a group of direct solar cells disposed thereon, each of the direct solar cells configured to receive direct sunlight and to provide electrical power to a respective portion of a first substantially flat flexible circuit; and the secondary surface having a group of indirect solar cells disposed thereon, each of the indirect solar cells configured to receive reflected sunlight and to provide electrical power to a respective portion of the first (or a second) substantially flat flexible circuit.

Each AA 106 may comprise a substantially planar solar panel, a curved solar panel, and/or a solar panel including various angled shapes. As such, any of the embodiments discussed herein with respect to a substantially planar solar panel may also be modified for use with curved, angled, shaped, and/or other solar panel configurations or dimensions.

As depicted in FIG. 1, the AA 106 comprises an optional core 110 having a front or sun-facing side supporting an optional first 120-1 facesheet, and a back or not-sun-facing side supporting an optional second 120-2 facesheet. In various embodiments, the primary and secondary sides of the core 110 are formed by the facesheets 120. In various embodiments, there are no facesheets 120; that is, solar cells are disposed directly on primary and secondary surfaces of the AA 106 (i.e., the solar panel does not have a honeycomb or other type of core, but comprises a monolithic solar panel having solar cells disposed on both faces). In various embodiments, there is no core 110; that is, the AA 106 comprises a sheet material having primary and secondary surfaces upon which solar cells are disposed directly or via a facesheet disposed upon the primary and secondary surfaces. These and other modifications are contemplated by the inventors and discussed herein.

As shown in FIG. 1, the primary surface or first facesheet 120-1 having a group 130D of direct solar cells disposed thereon, each of the solar cells within the direct group 130D being configured to receive direct sunlight and to provide electrical power therefrom to a respective portion of a first substantially flat flexible circuit 140-1 proximate or under the first facesheet 120-1. The electrical power from the direct solar cell group 130D is coupled to the satellite 105 via the first flat flexible circuit 140-1.

As shown in FIG. 1, the back surface or second facesheet 120-2 having a group 130ID of indirect solar cells disposed thereon, each of the solar cells within the indirect group of solar cells 130ID being configured to receive sunlight reflected from the earth (albedo) and to provide electrical power therefrom to a respective portion of a second substantially flat flexible circuit 140-2 proximate or under the second facesheet 130-2. The electrical power from the indirect solar cell group 130D is coupled to the satellite 105 via the second flat flexible circuit 140-2.

In various embodiments, the PV cells used in the direct solar cell group 130D comprise solar cells optimized for direct sunlight, and the PV cells used in the indirect solar cell group 130ID comprise solar cells optimized for reflected sunlight. In various embodiments, the PV cells used in the direct solar cell group 130D are the same as or substantially similar to those used in the indirect solar cell group 130ID (e.g., similar/same size, similar/same component type(s), similar/same power output, etc.) so as to provide a symmetrical AA. In some embodiments, given the lower intensity of reflected light such as captures/processed by the indirect solar cell group 130ID, the PV cells selected therefore may be selected based upon lighter weight and/or smaller size since any reduction in efficiency will be based upon a lower level of power generated in the first place.

PV cells may be arranged in 'strings' in which cells are attached in series and then the various strings are combined together in parallel. This permits solar arrays to generate the intended voltage while also isolating failures in a single cell from propagating beyond the string it is a part of. This string configuration is also merited in AA with the one note that strings in AA should not cross from one face to the other. That is, all cells on a given string should be on the same face. This has utility for resiliency purposes as well as for manufacturing purposes. It is likely that a builder of AA would default to this approach, but it bears specific mention here. It is noted that each individual PV cell normally has a bypass diode mechanically attached, so that if a PV cell is damaged only that PV cell's power is lost. The various embodiments may use a standard of practice cell+bypass diode as a single unit, or integration of the bypass diode into the flex circuit (i.e., not mechanically attached to the corresponding PV cell).

As depicted in FIG. 1, a honeycomb core used as the core is shown in a deployed mode of operation of a solar panel.

In some embodiments, the honeycomb core and the solar panel formed therewith comprises one of a plurality of honeycomb cores/solar panels which are connected via hinges, gimbals, and/or other folding, extending, or rotation mechanism(s) 104 and form a solar wing configured to be folded via the hinges in a nondeployed (stowed) mode of operation, and unfolded via the hinges in a deployed mode of operation. A single deployed solar panel is shown in FIG. 1. Generally speaking, various embodiments contemplate that, in some spacecraft, the solar wing(s) deploy substantially after the satellite is separated from the launch vehicle (i.e. days or even weeks) in some cases. It is desirable for the solar wing(s) be folded such that an outermost solar panel has its solar cells facing outwards so as to allow the spacecraft to collect a little bit of power even while stowed. With conventional spacecraft having cells only on one face, this creates a constraint that dictates towards which direction the accordion fold process must start in order to terminate with the cells facing outwards. This can sometimes force solar array designers to have to make compromises regarding the length of the yoke (the structure that connects the innermost solar panel to the spacecraft) and coverage of the solar panels over the thermal radiators (the stowed solar panels serve a function of thermally insulating the thermal radiators prior to deployment. Various embodiments are configured to adapt as needed to any of these design goals.

In various embodiments, a textured transparent material is disposed upon the array of indirect solar cells. That is, since albedo lighting is diffuse, various embodiments optionally use a textured transparent material (e.g., glass, plastic, and so on) disposed over or upon the indirect solar cell group 130ID, which operate to enhance off-normal efficiency of the indirect or albedo cells.

The albedo array 106 may be implemented using rigid, flexible, or a combination of rigid and flexible structures.

In various embodiments, a harness is used to route power from the indirect solar cell group 130ID to the satellite 105. As previously noted, albedo cells can be the same design as direct solar cells, but some cost-conscious missions may prefer to use cheaper Si cells on the albedo side where illumination intensity is lower. Solar panels today generally can achieve up to 92% packing density. With flex circuit layouts, this can be substantially increased. If flex circuits are not used for the albedo array, about 60% coverage of cells is optimistic. If using flex circuit, 92% coverage or greater can also be achieved on the back side.

In various embodiments, direct and indirect solar cells are different in terms of their cost and/or radiation hardness. For example, where direct solar cells are expected to experience substantially more radiation than indirect solar cells, the radiation hardness (and therefore cost) of the selected direct solar cells may be substantially higher than that of the indirect solar cells.

Figure 2:
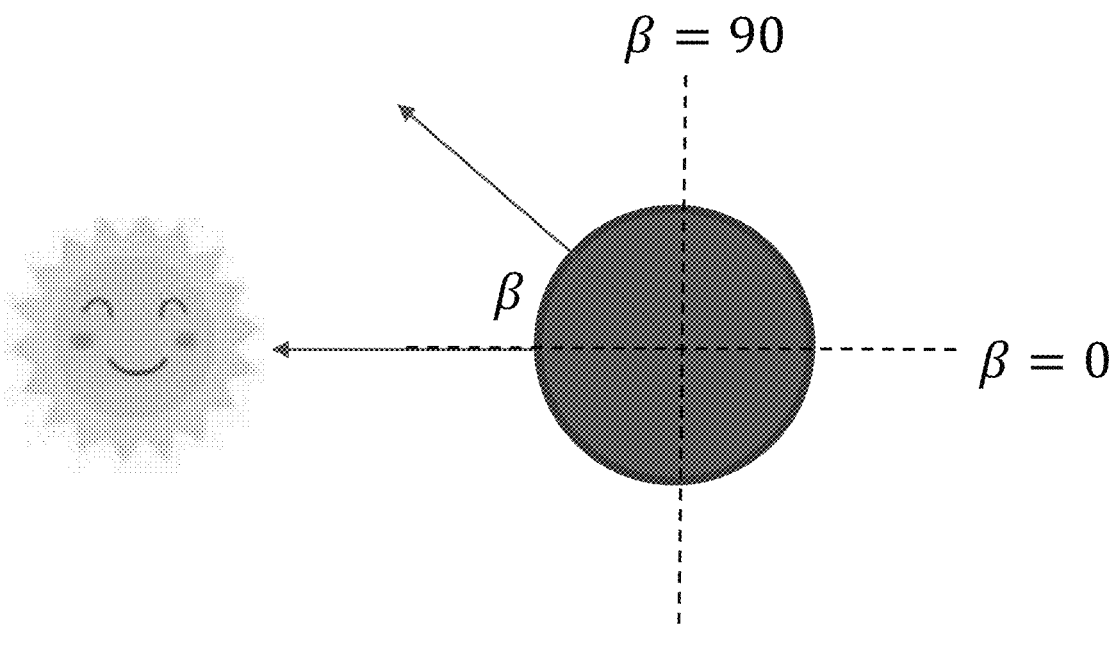
FIG. 2 illustrates beta angle considerations relevant to control and orbital management of the embodiments discussed herein.

FIG. 2 illustrates beta angle considerations relevant to control and orbital management of the embodiments discussed herein. Specifically, referring to FIG. 2, orbit beta angle is defined as the angle between the earth-sun vector and the orbital plane, and can range from 0 to 90 deg. Beta tends to range for most spacecraft between plus/minus the sum of the inclination of the sat's orbit plane and the earth's declination (23.5 deg). Satellites in polar orbits can have beta angle vary throughout 0 to 90 over time. The variations of beta angle mean that typical spacecraft solar arrays generate more power at Beta 90 due to less fraction of the orbit in eclipse. The albedo array as described herein in accordance with the various embodiments enhances the power generation capability in low beta cases (e.g. beta 0)

since more time is spent closer to the subsolar point where albedo is greatest. This flattens the driving design case from beta 0 to a range of low abs (beta) angles. Thus, the albedo array is especially well suited for low inclination, low earth orbits, which are a very common type of orbit. Low inclination orbits tend to have low absolute values of beta angle, although beta angle tends to vary seasonally throughout a range for most orbits (i.e., non-sun-synchronous orbits).

The AA is especially useful for non-inclined, low earth orbits (LEO). The analysis on AA performance has been evaluated in such orbits. It is further noted that useful performance enhancements can also be achieved at moderately inclined, somewhat higher orbits as well.

Various embodiments contemplate other applications, such as for space probes orbiting other planets. The outer planets might be able to make the most of the weak sunlight using AA and the inner planets (Venus and Mercury) might be able to use photovoltaic arrays running entirely on albedo power while protecting the array behind a sunshield safe from the intense heat and ionizing radiation of the sun.

Various embodiments contemplate that AAs can be made to be either symmetric or non-symmetric. Symmetric AA's have substantially the same design and power generation capacity on both faces (for a given light energy source), where-as nonsymmetric AAs have different designs on the two faces. Symmetric AAs offer the most capacity since both sides are equally capable but nonsymmetric AAs can be made less expensively while still achieving performance enhancements over conventional solar arrays that do not implement the AA tech.

Concepts of Operation

Figure 3A:
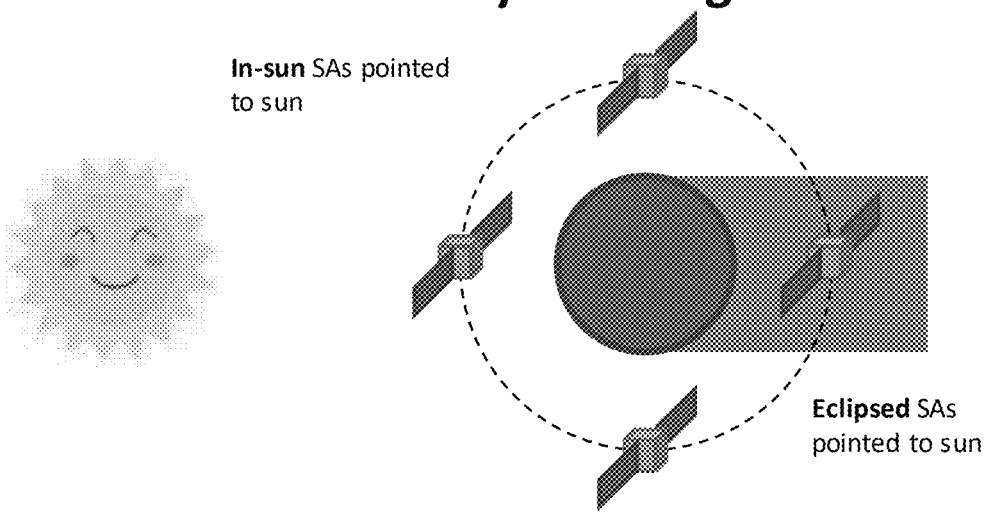
FIG. 3A illustrates current satellite solar array Concepts of Operation (CONOPs)

FIG. 3A illustrates current satellite solar array Concepts of Operation (CONOPs). Specifically, referring to FIG. 3A, it can be seen by inspection that the solar array of a satellite remains pointing toward the sun at all times during satellite orbit, even during a solar eclipsed portion of satellite orbit.

Figure 3B:
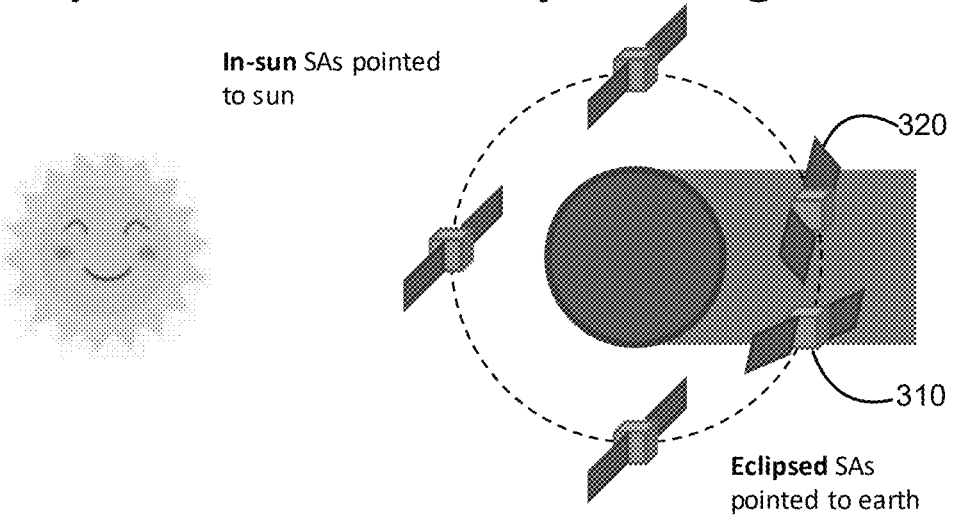
FIG. 3B illustrates improved satellite solar array CONOPs in accordance with various embodiments.

FIG. 3B illustrates improved satellite solar array CONOPs in accordance with various embodiments.

Figure 4:
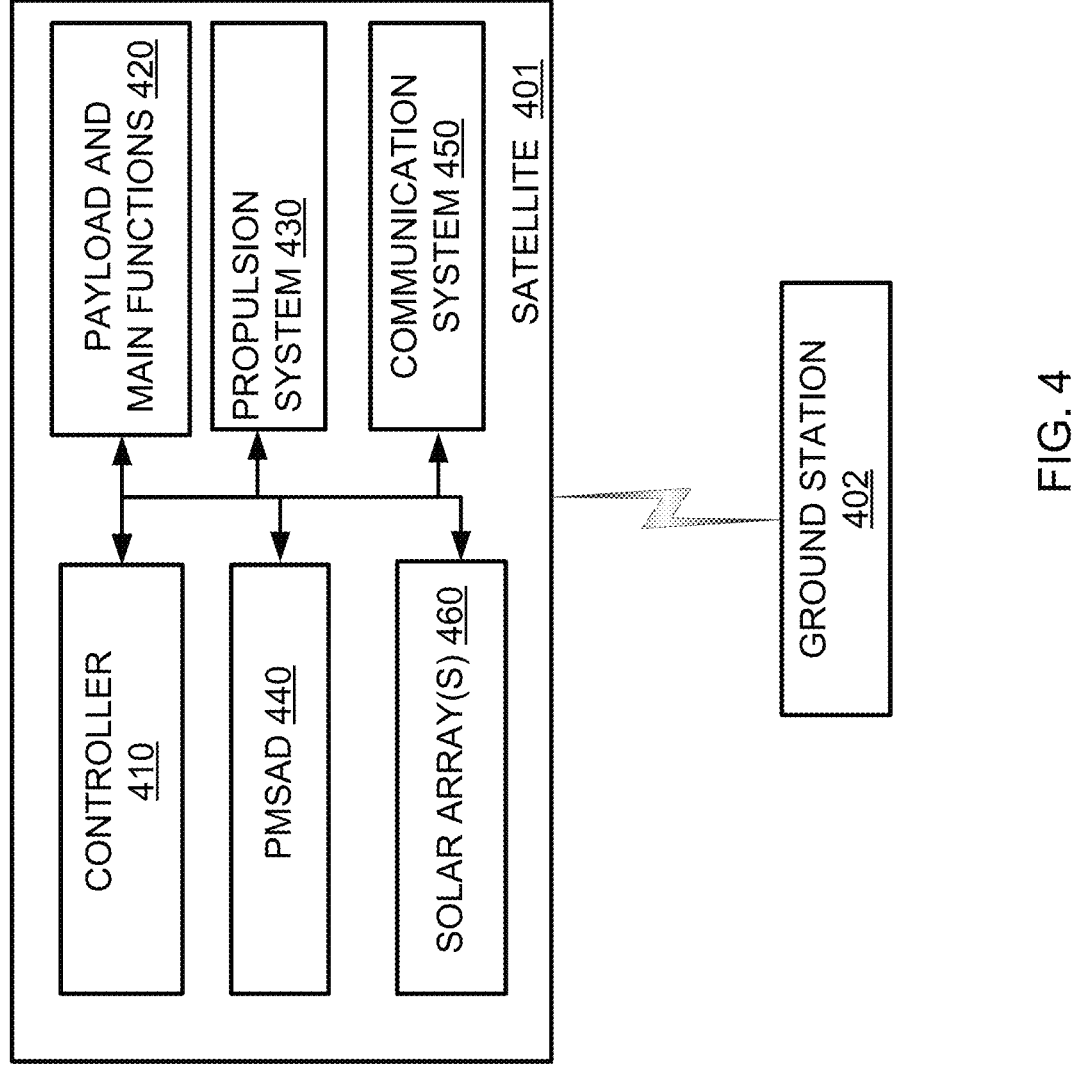
FIG. 4 depicts a simplified block diagram of a system according to an embodiment.

FIG. 4 depicts a simplified block diagram of a system according to an embodiment. Specifically, FIG. 4 depicts a satellite (spacecraft) 401 having one or more solar arrays configured and operating as described herein, the satellite 401 being capable of communications with, and control by, a ground station 402.

The satellite 401 is depicted as including a controller (e.g., flight computer and/or other computing devices) 410, payload and main functions 410, a propulsion system 430, a Power Management, Storage, and Distribution (PMSAD) system 440, a communications system 450, and one or more solar array 460.

The controller 410 may be included within the payload and main functions 420 or may be independent as depicted. Generally speaking, the controller 410 includes control circuitry necessary to perform the various tasks described herein with respect to the embodiments. The controller 410 may be implemented as a special purpose or general purpose computing device, including a processor element (e.g., a central processing unit (CPU) or other suitable processor(s)), a memory (e.g., random access memory (RAM), read only memory (ROM), and the like), and various input/output devices (e.g., communications modules, network interface modules, receivers, transmitters and the like). Thus, the controller 410 provides a computing architecture suitable for implementing functional elements or portions thereof described herein with respect to the various embodiments. Such functions may include array deployment, sun sensing, processing ground station commands and so on. It is contemplated that some of the steps discussed herein may be implemented within hardware, for example, as circuitry that cooperates with the processor to perform various method steps, such as the operations described herein with respect to the various embodiments. Portions of the functions/elements described herein may be implemented as a computer program product wherein computer instructions, when processed by a computing device, adapt the operation of the computing device such that the methods or techniques described herein are invoked or otherwise provided. Instructions for invoking the inventive methods may be stored in tangible and non-transitory computer readable medium such as fixed or removable media or memory or stored within a memory within a computing device operating according to the instructions.

The payload and main functions 420 comprise the normal payload of the particular satellite, the main control and telemetry functions of the satellite and so on.

The propulsion system 430 may comprise, illustratively, a chemical or electric-driven propulsion (EP) system for generating some or all of the thrust necessary to move the satellite 401 such as described herein.

The PMSAD system 440 comprises energy storage (e.g. batteries), power management, power distribution, power charging, and other functions (e.g., routing power from the solar arrays 460 to batteries, etc.).

In an improved CONOP embodiment, the satellite is caused to point the primary face of the AA to nadir (position 310) in order to minimize exposure to galactic ionizing radiation such as by using the earth's mass as shielding and, to a lesser degree, the structure of the solar array itself as shielding.

In an improved CONOP embodiment, such as for symmetrically sided albedo arrays (i.e., the direct and indirect arrays being substantially similar is size or power generation ability), the satellite may be caused to switch or swap the sun-facing array (solar wind facing array) between the direct or primary face of the AA solar cell group 130D and the indirect or secondary face of the AA solar cell group 130ID (position 320) so as to balance array degradation due to ionizing radiation degradation over the life of the arrays or satellite. That is, in various embodiments a solar panel formed as an albedo array (AA) or other solar array may be controllably oriented via a hinge mechanism 104 or other mechanism configured to change presentation of the array so as to reduce incidence angle of ionizing radiation imparted to the PV cells of the array.

In various embodiments a solar panel formed as an albedo array (AA) or other solar array may be controllably oriented via a rotation mechanism 104 configured to change presentation of the array so as to reduce incidence angle of ionizing radiation imparted to the PV cells of the array. The rotation mechanism may comprise, illustratively, a gimbal configured to enabling rotating of the solar panel or array in at least one axis. In various embodiments, a rotation mechanism may be configured to enable rotation of an AA so as to selective present a front facing or rear facing group of PV cells toward the sun or other object.

That is, gimballed solar wings (i.e., solar wings able to be rotated by a gimbal or other mechanism an arbitrary number of times) may be pointed to the earth during eclipse and then pointed back to the sun just before orbital dawn. This can be achieved by means of commanding the solar array drive assembly (SADA) to repoint the solar array as close as possible to nadir just after orbital sunset. This can be done by means of an earth sensor which detects the earth's direction and/or by means of an open loop assumption about where the earth must be given the fact of eclipse and known orbital parameters. If this pointing CONOPs is implemented, there is a need for greater confidence in the array's ability to rediscover the sun when orbital dawn happens. This is provided in some embodiments by sun sensors, which may be implemented via sensors configured to measure sunlight and determine (e.g., via multiple sensor measurements) the direction of the sun with respect to the spacecraft.

In various embodiments the controller 410 is configured to cause the rotational mechanism 104 to rotate the AA 105 so as to reduce incidence angle of ionizing radiation imparted to the solar cells by adapting the angle of presentation of the solar cells to the sun (i.e., orientation of the AA with respect to the sun) in response to sun sensor data indicative of a present direction of the sun with respect to the solar cells, solar panel, and/or AA.

In various embodiments the controller 410 is configured to cause the rotational mechanism 104 to rotate the AA 105 so as to increase or decrease radiation incidence angle upon the solar cells as needed or desired. For example, the incidence angle may be reduced to avoid damage and/or when there is sufficient battery power such that further battery charging is unnecessary. Similarly, the incidence angle may be increased to promote more rapid battery charging if needed.

In various embodiments the controller 410 is configured in a first mode of operation to cause the rotational mechanism 104 to rotate the AA 105 so as to present the primary surface toward the sun, and in a second mode of operation so as to present the secondary surface toward the sun.

In various embodiments the controller 410 is configured in a protective mode of operation to cause the rotational mechanism 104 to rotate the AA 105 so as to present a minimum amount of the primary surface toward the sun.

The existing hardware and software for sun-tracking and sun-recovery on many modern spacecraft are likely sufficient, but this pointing CONOPs is likely to impose a few new lower level requirements on such systems. Accordingly, electrical power subsystem and attitude control engineers must work together to implement this pointing CONOPs. The risk that must be guarded against is the possibility that the spacecraft loses track of when orbital dawn is expected and/or which direction the sun will be facing and as a result does not properly repoint the array to sun just prior to orbital dawn. In the worst case scenario, the spacecraft could lose the sun and have to drop into safe mode to recover the sun which would entail being out-of-mission, likely for several hours.

In various embodiments, the AA 106 further includes sun sensors 160 of FIG. 1 secured to the solar panels (e.g., sensors 160-1 through 160-4) and/or spacecraft (e.g., sensor 160-5) at various orientations to enable thereby determination of solar light levels and determination of solar position, thereby allowing the spacecraft to accurately and immediately assess solar angle on the solar panels whenever the spacecraft is in-sun (i.e. not in eclipse. That is, sensors suitable for measuring solar power may be placed in various locations such that the power levels developed at each of the sensors may be used to determine which sensor(s) is directed at the sun, which are not (and by what angular amount).

Since some sun sensors have a relatively wide field of view (almost 180 degrees), they may be illustratively installed on each face of a solar array and provide sufficient coverage of expected sun sensing locations/direction. One only exception is if the sun is nearly edge-on to the solar array. In this case, illustratively mounting sun sensors on each edge of the solar wing, facing out from the solar wing, provide full coverage. Sun sensors may also be mounted on the body of the satellite or spacecraft and use their knowledge of the rotation angle of the solar array.

In addition, during mission design of symmetric AAs, Electrical Power Subsystem (EPS) analysts should evaluate how much EOL power generation savings can be achieved by swapping which face is sun-facing versus which one is earth-facing. In the detailed work of the analysis, a specific mission sequence for when to perform swaps of sides should be developed. Swaps could occur as little as only once per mission to as often as every-other-orbit. If implementing the first pointing CONOPs, the array already needs to make a 90 degree turn at each time it crosses the terminator, so it makes little difference whether it turns to one side to preserve the current sun-facing face as the sun-facing face for the next orbit or if it turns to the other side to swap faces. Another aspect of this detailed analysis is to determine how much radiation should be 'allocated' to each face. The simple assumption (used in this analysis) that both faces are allocated equal radiation is likely slightly suboptimal for EOL power generation since the earth-facing face will be generating less power. Accordingly, in some embodiments at EOL (and at times approaching EOL), the earth-facing face receives somewhat more radiation degradation than the sun-facing face which can build more power. With detailed planning, and with evaluation during the mission, proper apportioning of ionizing radiation dose to the two faces could allow the rate of degradation of power generation of an AA approaching EOL to be reduced relative to the rate that a conventional solar array would experience. Thus, further gains are possible for the enterprising designer and operator.

For agilely pointed missions which usually, though not necessarily, use non-gimballed rather than gimballed solar arrays, modification of pointing CONOPs may be implemented. As discussed earlier, mission pointing modes may be defined in terms of priorities of the various tasks. These tasks can include pointing payload to target to do mission, pointing solar array to sun to do power generation, pointing thermal radiators to space to sink heat, pointing communication antennas to communicants to send/receive information. In general, AA for such spacecraft means that there are now two different directions in which maximum power generation can be achieved and that there are no directions where no power can be achieved. This means that in mission modes where power generation is de-prioritized relative to other pointing tasks, some power generation is still achievable. This can enable other tasks to continue for longer before power needs to be given a higher priority, thus resulting in higher mission availability. Operationally, operators in such missions track key metrics such as spacecraft temperatures and battery state of charge in order to determine when to switch between mission modes. These same approaches can be used with satellites incorporating AA.

In another improved CONOP embodiment, such as for non-symmetrically sided albedo arrays or where it has been determined that one of the direct solar cell group 130D and indirect solar cell group 130ID is capable of withstanding a greater amount of radiation, the satellite may be caused to switch or swap the sun-facing array (solar wind facing array) between the direct solar cell group 130D and indirect solar cell group 130ID so as to expose the more durable solar cell array to more solar radiation than the less durable solar cell array.

In an improved CONOP embodiment, the albedo PV cells are optimized for a difference in the albedo spectrum versus the solar spectrum (i.e., a different distribution of wavelengths/colors of solar radiation/light). This improvement is especially useful for non-symmetric AAs where each side of the array is designed specifically to face either the earth or the sun.

Mechanical Engagement

The various AAs described herein are useful for any deployed solar array, whether mounted in a fixed or gimballed manner, whether rigid or flexible. The various AAs described herein may be used within the context of flexible substrate solar arrays such as the Rollout Solar Array and also deployed-but-not articulated-SAs (Solar Arrays).

The various AAs described herein may be used for non-gimballed deployed arrays, which are common on agile LEO spacecraft. "Agile LEO" is a mission CONOPs where distinct mission modes requires orienting the spacecraft differently in order to accomplish the overall mission. Common mission modes are payload mode, communication mode, and housekeeping mode which maintains power and thermal homeostasis.

In Agile LEO missions, which may have fixed (non-gimballed solar arrays), an albedo array has solar cells facing in two opposite directions vastly enhances the likelihood of making at least SOME power generation happen while in modes other than housekeeping mode. There are no inherent differences about how to fly a fixed, deployed, non-gimballed sat with an albedo array vs that already described here except that the proposed pointing CONOPS (above) may not make as much sense because albedo array pointing can't be decoupled from mission pointing in a fixed case vs in the gimballed case. Mission planners can design pointing CONOPs for mission mode in which the payload is pointed to the target but the spacecraft can still be rolled about the spacecraft-target axis in such a way as to maximize power generation. With a typical solar array, only one orientation in that rotation axis will be suited to maximize power generation. However, with an AA, the second side of the array offers a second orientation that can also generate power. This creates two options that can then be down selected for other purposes such as to achieve another pointing objective such as pointing thermal radiators to space or pointing communications antennas to other communicants. Not only this, but in situations where other pointing tasks (such as thermal pointing or communication pointing) take higher priority than power generation during mission mode, an AA substantially increases the likelihood that at least some power generation can happen via albedo. All of this enhances mission efficiency for agile LEO platforms.

As discussed above, non-gimballed solar arrays can benefit from AA. In addition, flexible substrate solar arrays such as ROSA, eCTA, MOSSA, Ultraflex, Megaflex, and the like can also benefit from Albedo Array. When using a flexible substrate approach with AA there is somewhat less ionizing radiation protection through the solar panel, which will reduce the performance improvements attributed to reduced ionizing radiation slightly—estimate a +10.0% rather than +10.4% improvement in W/m2.

In various embodiments, if the cost of procuring more solar cells is an issue, then cheaper 20% efficient (or more generally less than state of the art) Si cells or thin film cells can be used for the albedo side of the albedo array. +4% W/m2 gain can be achieved. However, this does not fully account for ionizing radiation damage on Si or thin film cells, so more detailed analysis is appropriate. There is no strict requirement to use the array pointing CONOPs described above for ionizing radiation reduction and balancing between faces (+9% W/m2 gain can still be achieved).

While analysis was performed for a zero degree inclination circular low earth orbit at 200 miles, nearly as good of results can be achieved for moderately inclined orbits and higher altitude orbits. At highly inclined orbits, e.g., 90 degrees, improvements are relatively more modest. As altitude increases, improvements of the albedo array over a normal solar array slowly slip away. Any LEO altitude is likely to have virtue with an albedo array.

Faces can be either designed to be symmetric (preferred embodiment) or, alternatively, the albedo face can be laid out with fewer cells (or lower quality cells) if needed. The alternative embodiment is less suited to swapping sides to balance radiation degradation, but the secondary face can be oriented to space during eclipse to shield the more valuable primary face.

Fixed or Gimballed arrays are suited for AA. Neither is the preferred embodiment: AA is intended for both types of array. Rigid or Flexible substrates can both benefit. Neither is the preferred embodiment: AA is intended for both types of substrate. Flexible substrates will have somewhat less radiation protection, but +10% W/m2 gain can still be achieved with flexible (+10.4% W/m2 with rigid).

Analysis

An analysis was performed to determine what performance enhancements AA can achieve. This analysis will now be described to elucidate the mechanisms by which AA offers benefits to spacecraft.

As stated earlier, earth albedo light can be up to 30% of the intensity of sunlight, however albedo in LEO is coming from all directions on earth which is large in the field-of-view of the spacecraft. Thus, albedo is not substantially specular in the way that sunlight is.

For a noninclined circular orbit 200 miles above the earth, beta angle ranges from −23.5 to 23.5 degrees, seasonally due to precession of the orbit and the earth's declination. Accounting for effects of orbital precession, orbital views, and albedo light, an albedo array with equal cell density and efficiency on the back side as the front side can achieve a 1.075 factor enhancement of electrical energy generation for a given array size. We speak in terms of enhancement factor such that the various enhancements can be multiplied together and then more familiar percentage point enhancements can be conveyed as final outcomes.

While this 1.075 factor of added power generation for a given array is the main value proposition, albedo array also has ancillary benefits in reducing operating temperature and ionizing radiation exposure, which further enhance performance.

Enhancement due to reducing ionizing radiation: in LEO, using the pointing CONOPs previously described (i.e. pointing the array to nadir when in eclipse to minimize exposure of the earth-facing side to ionizing radiation, the earth-pointed side can have essentially half the ionizing radiation exposure since the earth is large in the field of view and the structure of the solar panel and the cover glass of the PV cells on both sides all enhance radiation protection. By swapping which side faces the sun, we can reduce ionizing radiation exposure to 75% on both sides of what a normal solar array experiences. This reduction in ionizing radiation exposure leads to a 1.012 factor enhancement of electrical energy generation for a given array size.

Enhancement due to reducing operational temperature: Typical solar arrays run at about 67° C. per a hand calculation accounting for both solar and albedo heating in a noninclined LEO orbit with state-of-the-art solar cells. Under the same conditions the Albedo array runs at 56° C. due to converting more of the incident light (i.e. the albedo) into electricity rather than heat. This can lead the solar cells to run about 28.5% efficiency in AA rather than 28% efficiency in a conventional solar array. This results in a 1.015 factor enhancement of electrical energy generation for a given array size.

Taken altogether, the three improvements (1 collecting the albedo, 2 reducing ionizing radiation exposure, 3 reducing temperature) results in a net 1.104 factor enhancement=+ 10.4% improvement in solar power generation for a given array size! 10.4% may not sound impressive, but this is essentially equivalent to 55 years' worth of global progress in R&D on solar cell efficiency for LEO satellites at the cost of simply buying and integrating the albedo cells.

Advantageously, various embodiments provide enhanced power generation relative to the deployed area, stowed volume, mass, rotational inertia, and cost of the solar array yielding:

Enabling AFRL's goal of high power SmallSats: satellites that punch above their weight The invention is only useful for satellites in particular orbits, but these orbits are some of the most common orbits and all solar array performance metrics are enhanced by this technology, so there is very little reason not to use it Some optional pointing concepts of operation that are included in this technology can be excluded to reduce complexity at the cost of a minor reduction in performance gains. If these pointing CONOPs are excluded, there is very little reason indeed to not use it This tech can also be used to enhance total generating power for a fixed solar array size, this can be useful for satellite makers who generally must work in discrete counting number increments of solar panels per solar wing (e.g. 3-panel solar wing, 4-panel solar wing, 5-panel solar wing, etc.); this can be highly leveraged for spacecraft requiring just slightly more power than a given number of solar panels can generate but where adding an entire extra solar panel is too much Reduced ionizing radiation exposure leading to higher performance at End-of-Life (EOL) and/or extending mission life, as desired by designers For agilely pointed spacecraft, enhanced ability to generate some amount of electrical power while in Mission Mode, yielding longer duration of Mission Mode and higher mission duty cycle than existing alternatives to achieve these metrics The various embodiments find utility within the context of space probes orbiting bodies other than the earth. This can be used to maximize power generation in the outer planets or reduce environmental exposure in the inner planets.

Terrestrial albedo arrays are possible. Most terrestrial solar arrays are located at relatively lower latitudes where cloud cover is less. This means that the sun tracks relatively high through the sky which means that fixed orientation solar arrays facing substantially upward make the most sense. These arrays generally are located fairly close to the ground and the shadows they cast significantly reduce how much light is available on the back of the array. This makes an albedo array not useful in these cases. In situations where terrestrial solar arrays are gimballed to track the sun, and especially when such arrays are located at high latitudes, then an albedo array would have the opportunity to have unshaded views in the opposite direction to catch albedo from the sky and ground. Unfortunately, such solar arrays are rare due to terrestrial cloud conditions at high latitudes to make solar arrays unattractive.

Solar arrays on the lunar surface at the lunar poles have been proposed which are gimballed to rotate about a vertical axis. These solar arrays could possibly benefit from an albedo array approach. Unfortunately, the moon's lack of atmosphere means that no albedo is coming from the lunar sky. Also, the moon's reflectivity is actually quite low which means relatively little albedo is available from the lunar ground, even if there happens to be a good view to the ground.

Albedo arrays on the poles of other solar system bodies might fare better. Especially bodies that have high albedo and a reflective atmosphere. Mars in particular has bright polar icecaps and a reflective sky which would likely make an albedo array on the Martian poles attractive.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

In the preceding detailed description of exemplary embodiments of the invention, specific exemplary embodiments in which the invention may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present invention. It is also to be understood that other embodiments may be utilized, and that logical, architectural, programmatic, mechanical, electrical and other changes may be made without departing from general scope of the invention. The following detailed description is, therefore, not to be taken in a limiting sense, and the scope of the present invention is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present invention. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

What is claimed is:

1. A solar array, comprising:

at least one solar panel comprising a primary surface and a secondary surface;

the primary surface having a group of direct solar cells disposed thereon, each of the direct solar cells configured to receive direct sunlight and to provide electrical power to a respective portion of a first substantially flat flexible circuit; and the secondary surface having a group of indirect solar cells disposed thereon, each of the indirect solar cells configured to receive albedo and to provide electrical power to a respective portion of a second substantially flat flexible circuit.

2. The solar array of claim 1, wherein the at least one solar panel comprises a substantially planar solar panel.

3. The solar array of claim 1, wherein the at least one solar panel comprises a curved solar panel.

4. The solar array of claim 1, wherein the at least one solar panel comprises an angled or shaped solar panel.

5. The solar array of claim 1, further comprising a textured transparent material disposed upon the group of indirect solar cells.

6. The solar array of claim 1, wherein the direct solar cells comprise solar cells optimized for direct sunlight, and the indirect solar cells comprise solar cells optimized for albedo.

7. The solar array of claim 1, wherein the direct solar cells and indirect solar cells comprise substantially similar solar cells.

8. The solar array of claim 1, wherein the direct solar cells have a higher radiation hardness than the indirect solar cells.

9. The solar array of claim 1, wherein the solar array includes a rotation mechanism configured to reduce incidence angle of ionizing radiation imparted to the direct solar cells and the indirect solar cells.

10. The solar array of claim 9, wherein operation of the rotational mechanism is performed in response to sun sensor data indicative of a present direction of the sun with respect to the solar array.

11. The solar array of claim 10, wherein the solar array is configured for supplying power to a satellite connected thereto, the satellite comprising a controller configured to receive sun sensor data and responsively cause the rotational mechanism to control the orientation of the solar array with respect to the sun.

12. The solar array of claim 11, wherein the controller is configured in a first mode of operation to cause the rotational mechanism to present the primary surface toward the sun, and in a second mode of operation to cause the rotational mechanism to present the secondary surface toward the sun.

13. The solar array of claim 11, wherein the controller is configured in a protective mode of operation to cause the rotational mechanism to present a minimum amount of the primary surface toward the sun.

14. The solar array of claim 11, wherein the controller is further configured to cause the rotational mechanism to present the solar array toward the sun in response to orbital location data.

15. A satellite having at least one solar array, each solar array comprising:

at least one solar panel comprising a primary surface and a secondary surface;

the primary surface having a group of direct solar cells disposed thereon, each of the direct solar cells configured to receive direct sunlight and to provide electrical power to a respective portion of a first substantially flat flexible circuit; and the secondary surface having a group of indirect solar cells disposed thereon, each of the indirect solar cells configured to receive albedo and to provide electrical power to a respective portion of a second substantially flat flexible circuit.

16. The satellite of claim 15, wherein the at least one solar panel comprises a substantially planar solar panel.

17. The satellite of claim 15, wherein the at least one solar panel comprises one of a curved solar panel, an angled solar panel, and a shaped solar panel.

18. The satellite of claim 15, further comprising a controller configured to receive sun sensor data and responsively cause a rotational mechanism to control an orientation of the solar array with respect to the sun.

19. The satellite of claim 18, wherein the controller is configured in a first mode of operation to cause the rotational mechanism to present the primary surface toward the sun, and in a second mode of operation to cause the rotational mechanism to present the secondary surface toward the sun.

20. The satellite of claim 18, wherein the controller is configured in a protective mode of operation to cause the rotational mechanism to present a minimum amount of the primary surface toward the sun.

* * * * *